(12) United States Patent
Narita et al.

(10) Patent No.: US 6,392,202 B2
(45) Date of Patent: May 21, 2002

(54) HEATING APPARATUS FOR BUMP BONDING, BUMP BONDING METHOD AND BUMP FORMING APPARATUS, AND SEMICONDUCTOR WAFER

(75) Inventors: Shoriki Narita; Makoto Imanishi; Takaharu Mae; Nobuhisa Watanabe, all of Osaka-fu; Shinji Kanayama, Nara-ken., all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/955,110

(22) Filed: Sep. 19, 2001

Related U.S. Application Data

(62) Division of application No. 09/690,746, filed on Oct. 18, 2000.

(30) Foreign Application Priority Data

Oct. 19, 1999 (JP) ............................................ 11-296631

(51) Int. Cl.[7] .................................................. F27B 5/06
(52) U.S. Cl. ........................ 219/390; 219/392; 219/393; 219/400; 228/4.5; 228/14; 228/254
(58) Field of Search ................................. 219/385, 390, 219/392, 393, 400, 405, 411, 521, 209; 118/224, 225, 50.1, 730; 392/416, 418; 228/254, 179, 14, 4.5

(56) References Cited

U.S. PATENT DOCUMENTS

| | | | | |
|---|---|---|---|---|
| 5,060,843 A | * | 10/1991 | Yasuzato et al. | 228/179 |
| 5,573,170 A | * | 11/1996 | Sasaki et al. | 228/14 |
| 5,899,140 A | * | 5/1999 | Yamamoto et al. | 100/35 |
| 5,933,752 A | * | 8/1999 | Yanagida | 438/613 |
| 6,161,747 A | * | 12/2000 | Ushiki et al. | 228/4.5 |
| 6,302,317 B1 | * | 10/2001 | Narita et al. | 228/254 |

* cited by examiner

Primary Examiner—Teresa Walberg
Assistant Examiner—Shawntina T. Fuqua
(74) Attorney, Agent, or Firm—Wenderoth, Lind & Ponack, L.L.P

(57) ABSTRACT

An object of the present invention is to provide a bump-bonding heating apparatus, a bump bonding method and a bump forming apparatus which do not involve large-sized apparatus configuration and which are easy to handle, and a semiconductor wafer in which bumps are formed by using the bump bonding method. The bump-bonding heating apparatus has a wafer turning member, a turning unit and a wafer heating unit. The turning member is turned by the turning unit without turning the wafer heating unit, whereby a semiconductor wafer mounted on the turning member is turned. Like this, since the wafer heating unit is not turned, the apparatus configuration can be made compact. Since the turning member is turned directly by the turning unit, the turning angle of the semiconductor wafer can be implemented with higher precision as compared with the conventional gas floating type turning method.

4 Claims, 14 Drawing Sheets

HEATING APPARATUS FOR BUMP BONDING, BUMP BONDING METHOD AND BUMP FORMING APPARATUS, AND SEMICONDUCTOR WAFER

This application is a divisional application of application Ser. No. 09/690,746, filed Oct. 18, 2000.

BACKGROUND OF THE INVENTION

The present invention relates to a bump-bonding heating apparatus for heating a semiconductor wafer placed on the heating apparatus to a bump bonding temperature in a process of forming bumps at electrode portions on circuits formed on the semiconductor wafer, a bump bonding method to be carried out by using the bump-bonding heating apparatus, a bump forming apparatus equipped with the bump-bonding heating apparatus, and a semiconductor wafer having bumps bonded by the bump forming apparatus.

Conventionally, a bump forming apparatus is equipped with the bump-bonding heating apparatus. As shown in FIGS. 24 and 25, in the conventional bump-bonding heating apparatus 1, gas is jetted out, through gas jet paths 4 opened at a heat stage 2, to a semiconductor wafer 3 which has been carried into the bump-bonding heating apparatus and placed on the heat stage 2 so that the semiconductor wafer 3 is heated to a bump bonding temperature. By this gas jet, the semiconductor wafer 3 is rotated circumferentially of the semiconductor wafer 3 on the heat stage 2 so as to be set to a preset rotational angle. For such a gas-floating type direct turning method for the semiconductor wafer 3, only a gas supply unit 5 needs to be provided as a structure for turning the semiconductor wafer 3. This allows the bump-bonding heating apparatus 1 to be made compact, and thus this direct turning method is preferable.

However, the bump-bonding heating apparatus of the above structure has the following problems. That is, in the case where the semiconductor wafer 3 is a charge-producing semiconductor substrate that produces charges from temperature differences due to the heating to the bump bonding temperature or other reasons, the charge-producing semiconductor substrate, when mounted on the heat stage 2, is electrostatically adhered onto the heat stage 2 by the electrification of the charge-producing semiconductor substrate. Also, in order to turn the semiconductor wafer 3 to the preset rotational angle, it would be necessary to control a pressure, flow rate and the like of the gas jet according to a size and weight of the semiconductor wafer 3, making the apparatus difficult to handle. It is also difficult to turn the semiconductor wafer 3 to the preset rotational angle at high accuracy.

Meanwhile, without adopting the gas-floating type turning method for the semiconductor wafer 3, a structure in which the heat stage 2 with the semiconductor wafer 3 held thereto is rotated could be conceived. This structure, however, would involve increasing the size of the apparatus, disadvantageously.

SUMMARY OF THE INVENTION

The present invention having been accomplished with a view to solving these and other problems, an object of the invention is to provide a heating apparatus for bump bonding which does not involve large-sized apparatus configuration and which is easy to handle, a bump bonding method to be executed in the heating apparatus for bump bonding, a bump forming apparatus equipped with the heating apparatus for bump bonding, and a semiconductor wafer having bumps bonded by the bump forming apparatus.

In order to achieve the above object, the present invention has the following constitutions.

In a first aspect of the invention, there is provided a heating apparatus for bump bonding, comprising:

a wafer turning member, on which a semiconductor wafer is placed for bump bonding, for rotating the placed semiconductor wafer on the wafer turning member in a circumferential direction of the wafer;

a turning unit for rotating the wafer turning member along the circumferential direction; and a wafer heating unit, on which the wafer turning member is placed, for heating the semiconductor wafer to a bump bonding temperature via the wafer turning member, the wafer heating unit being disposed in spite of the rotation of the wafer turning member.

In the first aspect of the invention, the heating apparatus for bump bonding may further comprise a control unit for controlling operation of the turning unit so that the wafer turning member is rotated at a turning angle required for the semiconductor wafer placed on the wafer turning member.

In the heating apparatus for bump bonding, the wafer turning member may have a wafer stage on which the semiconductor wafer is placed, and a turntable on which the wafer stage is placed and for holding the wafer stage by suction operation, the turntable being placed on the wafer heating unit.

In the heating apparatus for bump bonding, the wafer heating unit may have a turntable mounting plate on which the turntable is placed; a heater inserted and extended along a hole, the hole being formed in the turntable mounting plate along a direction perpendicular to a thicknesswise direction of the turntable mounting plate; and a support member for supporting the turntable mounting plate, the support members extending along a direction perpendicular to both directions of the thicknesswise direction and the extending direction of the heater.

In the heating apparatus for bump bonding, the turntable may have teeth formed at a peripheral part of the turntable, and the turning unit comprises a driving source, a gear wheel engaged with the teeth of the turntable, and a rotational-force transmission mechanism for preventing heat of the turntable from transferring to the driving source and for transmitting a driving force generated by the driving source to the gear wheel to thereby turn the gear wheel.

The heating apparatus for bump bonding may further comprise a lifter unit for lifting and lowering the wafer turning member between a heating position and a transfer position along a thicknesswise direction of the semiconductor wafer placed on the wafer turning member, the heating position being a position where the wafer turning member makes contact with the wafer heating unit so that the semiconductor wafer is heated to the bump bonding temperature via the wafer turning member, and the transfer position being a position where the wafer turning member is positioned when the wafer turning member is turned.

The heating apparatus for bump bonding may further comprise a blow unit for floating the semiconductor wafer placed on the wafer turning member from the wafer turning member by gas blow, and a regulating unit for performing positional regulation of the semiconductor wafer on the wafer turning member while the semiconductor wafer is floating from the wafer turning member.

In the heating apparatus for bump bonding, the semiconductor wafer is a wafer on which SAW filter devices are formed, and when the SAW filter devices are formed along a skewed direction which is skewed to a crystal orientation of the wafer prior to formation of the SAW filter devices, the turning angle required for the semiconductor wafer placed on the wafer turning member by operation control of the turning unit is an angle which depends on a difference between the crystal orientation and the skewed direction.

In a second aspect of the invention, there is provided a bump bonding method comprising:

mounting a semiconductor wafer, on which bumps are to be formed, onto a wafer turning member;

turning only the wafer turning member with the semiconductor wafer placed thereon along a circumferential direction of the semiconductor wafer at a turning angle required for the semiconductor wafer without turning a wafer heating unit provided for heating the semiconductor wafer to a bump bonding temperature via the wafer turning member; and after the turning, bonding the bumps on the semiconductor wafer at the bump bonding temperature.

In a third aspect of the invention, there is provided a bump forming apparatus which comprises the heating apparatus for bump bonding of the first aspect.

In a fourth aspect of the invention, there is provided a semiconductor wafer on which a bump is formed by the bump bonding method of the second aspect.

In a fifth aspect of the invention, there is provided a semiconductor wafer on which bumps are formed in a circuit by a process comprising, after forming the circuit along a direction which is different from a crystal orientation of the semiconductor wafer and is skewed with respect to the crystal orientation, turning the semiconductor wafer at an angle which depends on a difference between the crystal orientation and the skewed direction.

As described in detail above, according to the heating apparatus for bump bonding in the first aspect of the present invention, as well as to the bump bonding method in the second aspect, the apparatus has a turning member, a turning unit and a wafer heating unit, wherein the turning member is turned by the turning unit without turning the wafer heating unit so that the semiconductor wafer mounted on the turning member is turned. Therefore, since the wafer heating unit is not turned, an apparatus configuration can be made compact. Besides, since the turning member is turned directly by the turning unit, a turning angle of the semiconductor wafer can be implemented with higher accuracy as compared with a conventional gas floating type.

Also, in the bump forming apparatus equipped with the aforementioned heating apparatus for bump bonding in the third aspect of the invention, the turning angle of the semiconductor wafer can be controlled with high accuracy as described above. Therefore, bump forming positions on the semiconductor wafer can be controlled with higher accuracy as compared with the conventional apparatus.

In the semiconductor wafer of the fourth aspect of the invention, on which bumps are bonded with the aforementioned bump bonding method of the second aspect, the turning angle of the semiconductor wafer can be controlled with high accuracy as described above. Therefore, bumps can be formed at bump forming positions on the semiconductor wafer with higher accuracy as compared with the conventional counterpart.

BRIEF DESCRIPTION OF THE DRAWINGS

These and other aspects and features of the present invention will become clear from the following description taken in conjunction with the preferred embodiments thereof with reference to the accompanying drawings, in which:

FIG. 12 is a view showing a relationship between the turntable and the guide rollers provided in the bump-bonding heating apparatus shown in FIG. 1;

FIG. 13 is a perspective view of a wafer regulating unit provided in the bump-bonding heating apparatus shown in FIG. 1;

DETAILED DESCRIPTION OF THE PREFERRED EMBODIMENTS

Figure 1:
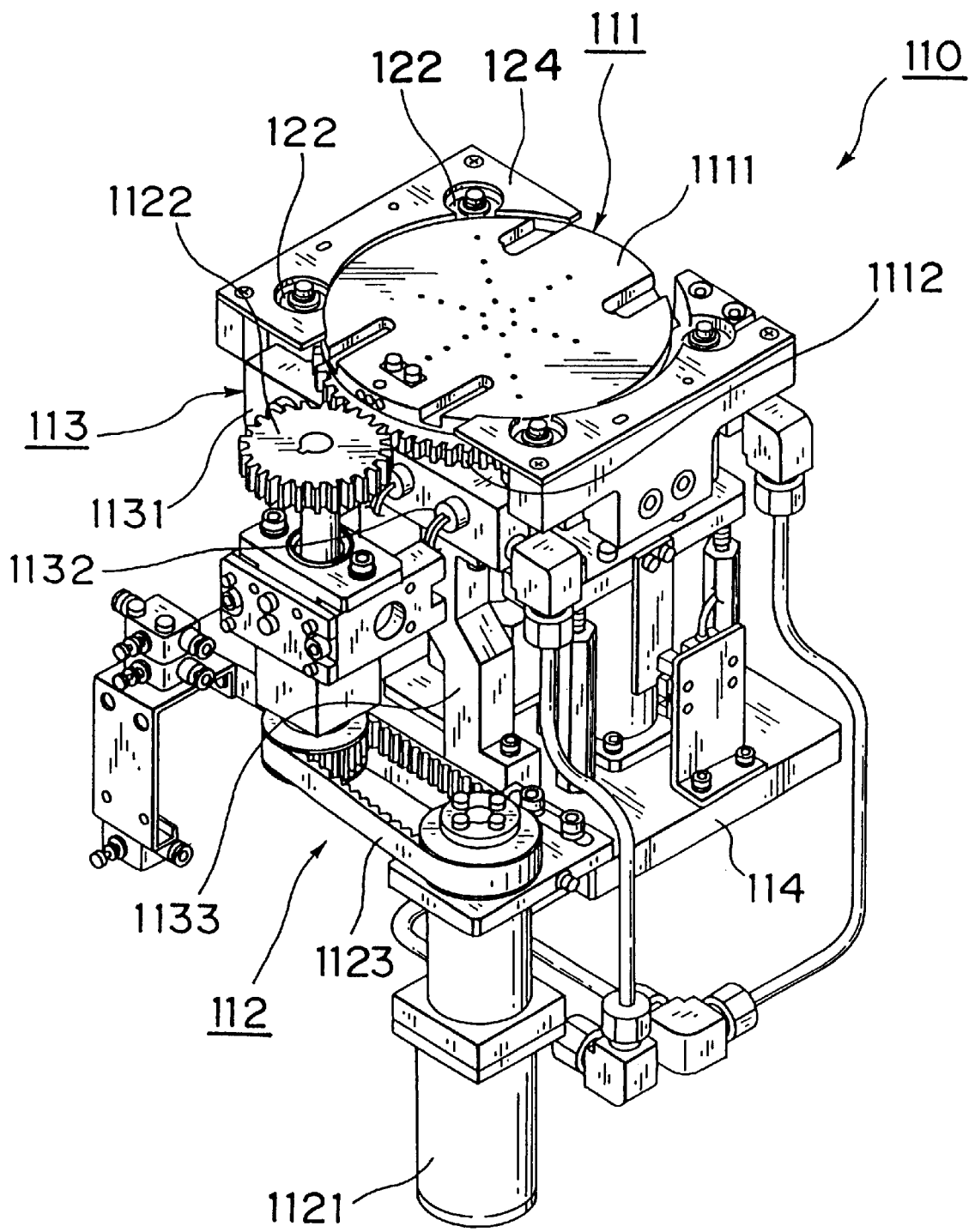
FIG. 1 is a perspective view of a bump-bonding heating apparatus according to an embodiment of the present invention.

Before the description of the present invention proceeds, it is to be noted that like parts are designated by like reference numerals throughout the accompanying drawings.

Hereinbelow, a heating apparatus for bump bonding (hereinafter, referred to as "a bump-bonding heating apparatus") which is an embodiment according to the present invention, a bump bonding method to be carried out by the bump-bonding heating apparatus, a bump forming apparatus equipped with the bump-bonding heating apparatus, and a semiconductor wafer in which bumps are formed by using the bump bonding method are described with reference to the accompanying drawings.

In this embodiment, a semiconductor wafer to be processed is exemplified by a charge-producing semiconductor substrate that produces charges, thereby being electrified, due to temperature changes from room temperature to a bump bonding temperature. This embodiment is suitable for a processing of, among others, a wafer-like piezoelectric substrate (hereinafter, referred to as "piezoelectric substrate wafer") for forming a SAW filter. However, the processing target is not limited to the piezoelectric substrate wafer. The bump-bonding heating apparatus of this embodiment is applicable also to the charge-producing semiconductor substrate, for example, compound semiconductor wafers of LiTaO$_3$, LiNbO$_3$ or the like, quartz semiconductor wafers using a quartz substrate, and the like. Further applicable are Si semicondoctor wafers using a Si substrate. In such a case, the Si wafers is heated to 250° C.–about 270° in a process of forming the bumps.

Figure 22:
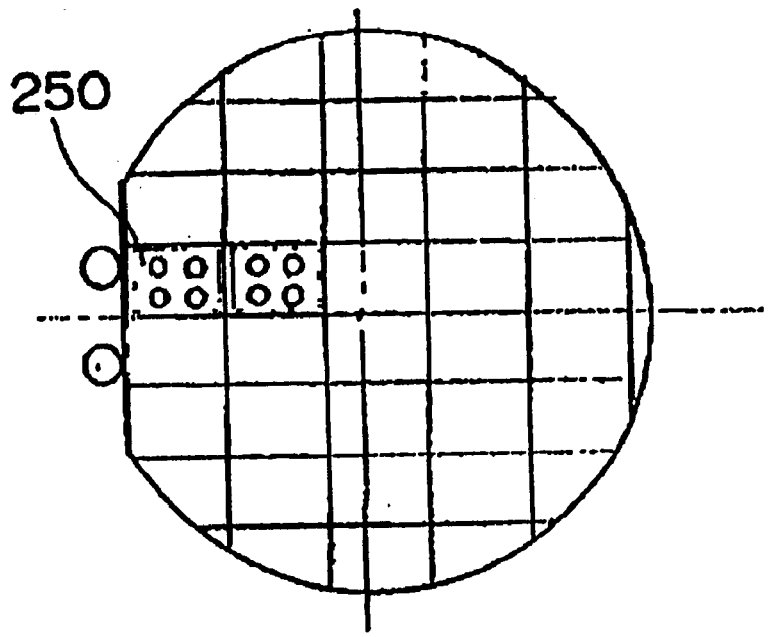
FIG. 22 is a view showing a conventional semiconductor wafer in which circuits are formed along the crystal orientation of the semiconductor wafer.
Figure 23:
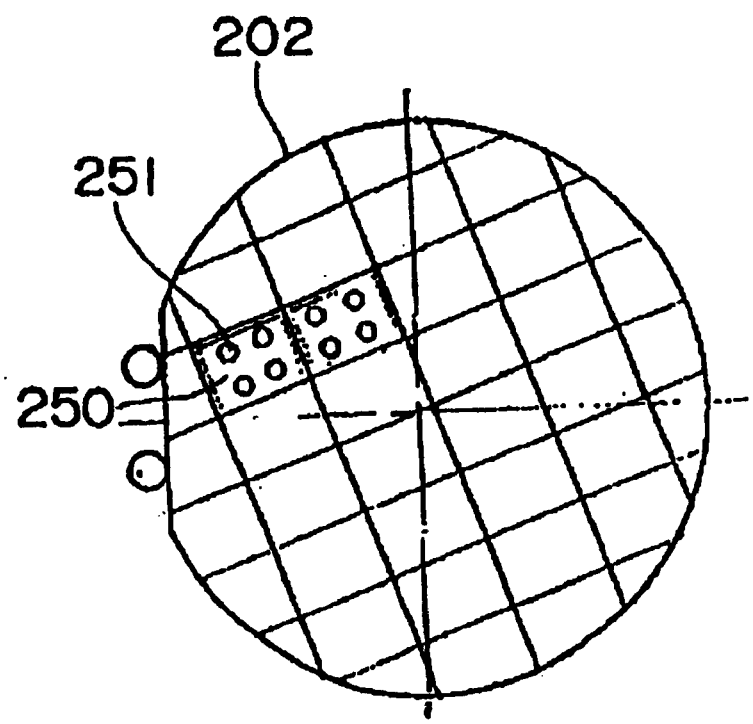
FIG. 23 is a view showing a semiconductor wafer in which circuits are formed along a direction skewed with respect to the crystal orientation of the semiconductor wafer.
Figure 24:
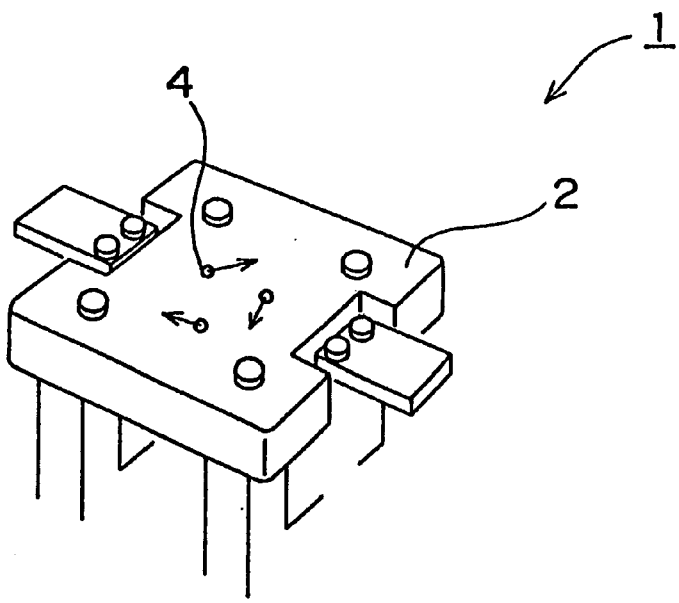
FIG. 24 is a perspective view of a bump-bonding heating apparatus according to a conventional art.
Figure 25:
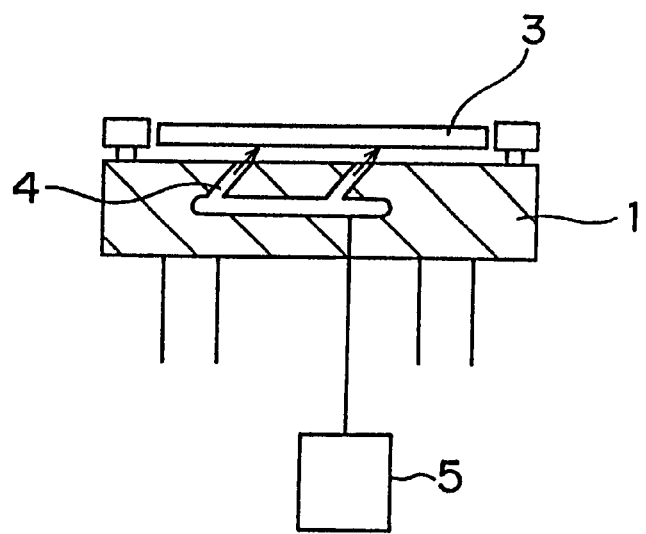
FIG. 25 is a view showing a state in which a wafer is floated by gas jet-out performed in the bump-bonding heating apparatus according to the conventional art.

The SAW (Surface Acoustic Wave) filter has been available as a semiconductor device for transferring only signals of specified frequencies. In recent years, however, due to increased numbers of frequencies involved, there have been occurring not only conventional cases, as shown in FIG. 22, where a device 250 is formed along a direction perpendicular to a crystal orientation of the wafer but also cases, as shown in FIG. 23, where a semiconductor wafer 202 in which, for example, the SAW filter devices 250 are formed along a direction skewed with respect to the crystal orientation and moreover bumps 251 are bonded on the devices 250 is fabricated. When the bumps are formed on such the wafer in which the device is formed along the skewed direction, there arises a need of turning the wafer to an extent corresponding to a skewed angle, which depends on a difference between the crystal orientation and the skewed direction, in terms of the relation with the movable direction of a bump-forming head. That is, there has been arising a need for turning the wafer at higher accuracy, as compared with the conventional case. The bump-bonding heating apparatus, bump bonding method, and bump forming apparatus of this embodiment are effective especially for semiconductor wafers that need to be turned to the skew angle.

As shown in FIG. 1, a bump-bonding heating apparatus 110 of this embodiment, roughly speaking, has a wafer turning member 111, a turning unit 112, and a wafer heating unit 113. The wafer turning member 111, on which the piezoelectric substrate wafer 201 prior to a bump formation process in which bump bonding is performed (hereinafter, referred to as "bump-unformed wafer") is mounted, is turned circumferentially of the bump-unformed wafer 201 mounted on the wafer turning member 111. Bumps are formed by a bump-forming head 190 in electrode portions on the bump-unformed wafer 201 mounted on the wafer turning member 111 at the bump bonding temperature, which is about 210° C in this embodiment. Hereinafter, the piezoelectric substrate wafer after the bump formation is referred to as "bump-formed wafer 202."

The wafer turning member 111 has a metallic, disc-shaped wafer stage 1111 on which the bump-unformed wafer 201 is to be mounted and which is larger in diameter than the bump-unformed wafer 201, and a metallic, disc-shaped turntable 1112 which is generally equal in size to the wafer stage 1111.

The turntable 1112, which is manufactured by tempering at a temperature beyond the temperature of 210° C., never exhibits distortion when heated to about the temperature of 210° C. The turntable 1112, on which the wafer stage 1111 is to be mounted, has teeth 11127 formed over the entire circumference of the turntable 1112 in this embodiment, the teeth 11127 being for mesh with a later-described gear wheel 1122 provided in the turning unit 112.

Figure 5:
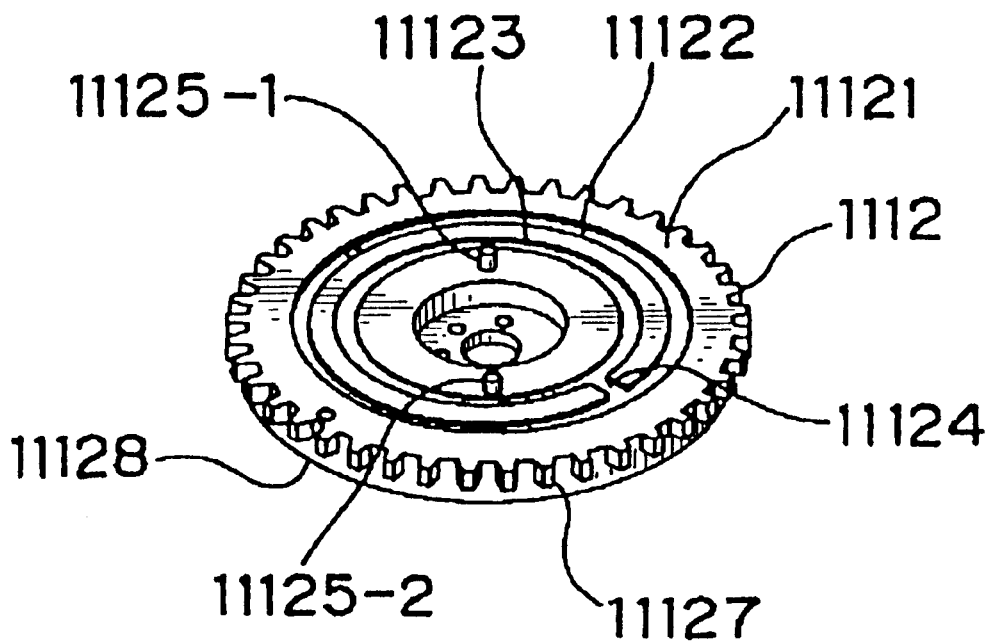
FIG. 5 is a perspective view showing a turntable provided in the bump-bonding heating apparatus shown in FIG. 1.

Also, as shown in FIG. 5, in a mounting surface 11121 of the turntable 1112, on which the wafer stage 1111 is to be mounted, are formed a first suction groove 11122 larger in diameter and a second suction groove 11123 smaller in diameter, concentrically with each other. The first suction groove 11122 and the second suction groove 11123 are communicated with each other by a communicating portion 11124. Further, the first suction groove 11122 and the second suction groove 11123 communicate with a suction passage 11126 formed in the turntable 1112, and air in the first suction groove 11122 and the second suction groove 11123 as well as the suction passage 11126 is sucked up by a suction unit 117 as described later. Therefore, the wafer stage 1111 mounted on the mounting surface 11121 can be sucked to the mounting surface 11121 by the sucking operation of the suction unit 117. Also, by the first suction groove 11122 and the second suction groove 11123 being formed over the entire circumference of the turntable 1112, the wafer stage 1111 can be sucked to the mounting surface 11121 uniformly over the entire circumference.

The reasons why a construction that the wafer stage 1111 is held to the turntable 1112 by suction like this is adopted are as follows. That is, since the wafer stage 1111 needs to be replaced depending on thickness and size of the semiconductor wafer to be processed, one reason is to facilitate this replacement operation. Besides, whereas the turntable 1112 and the wafer stage 1111 are heated to about 210° C. in order to heat the bump-unformed wafer 201 to the bump bonding temperature of about 210° C. in this embodiment, another reason is to permit thermal expansion of the wafer stage 1111 caused by the heating process.

Further, on the mounting surface 11121 of the turntable 1112, two positioning pins 11125-1, 11125-2 are erectly provided for positioning the wafer stage 1111 to be mounted on the mounting surface 11121.

Figure 2:
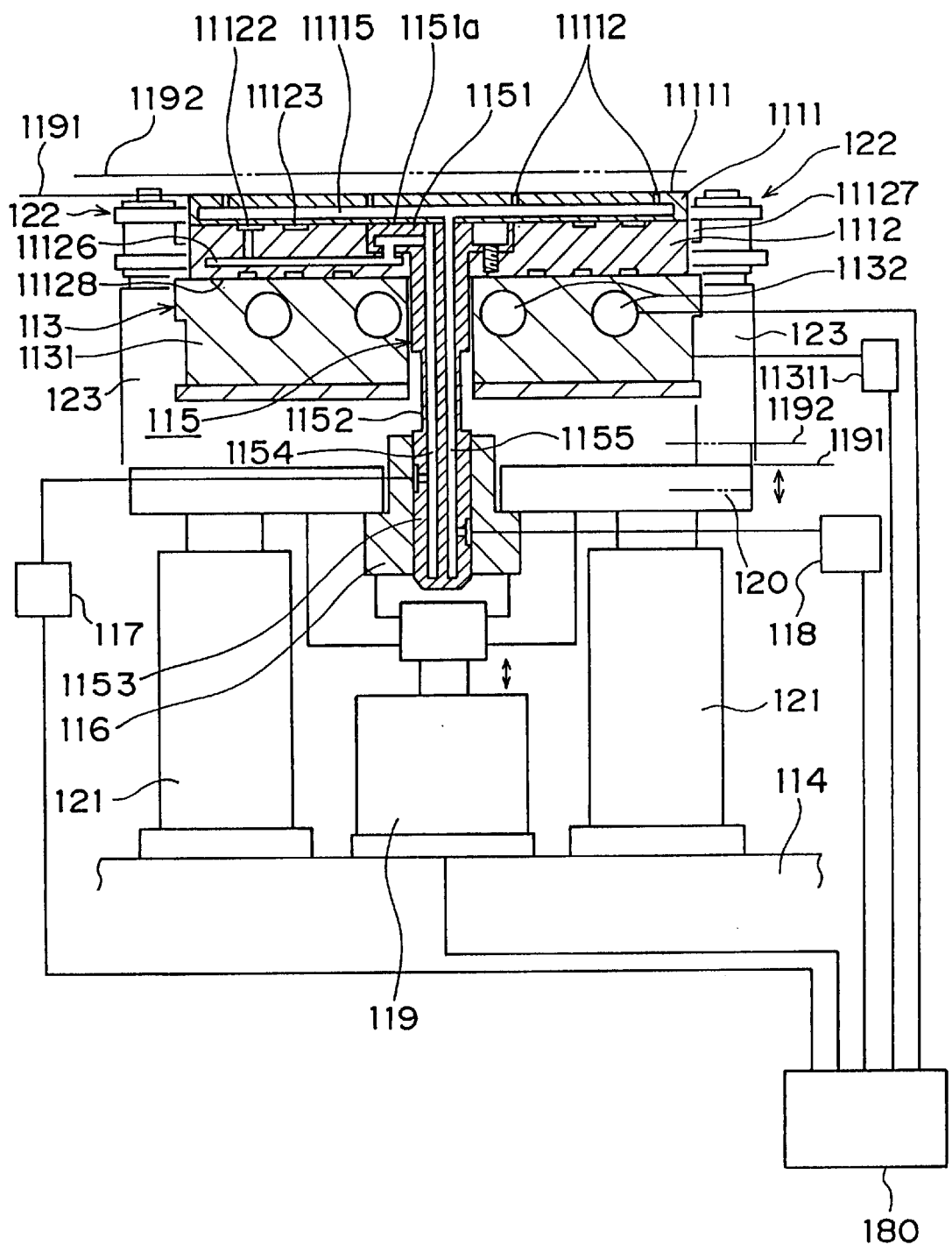
FIG. 2 is a sectional view of the bump-bonding heating apparatus shown in FIG. 1.

At a central portion of the turntable 1112 formed in the above way, is attached a T-shaped joint 115 as shown in FIG. 2. This joint 115 is composed of a disc-shaped fitting portion 1151 buried relative to the turntable 1112, and a passage forming portion 1152 erectly provided at the fitting portion 1151 and formed integrally with the fitting portion 1151. With the joint 115 attached to the turntable 1112, the passage forming portion 1152 protrudes beyond a rear surface 11128 of the turntable 1112, extending through the heating unit 113 in a rotatable state relative to the heating unit 113 having the turntable 112 mounted on the heating unit 113, and the passage forming portion 1152 is rotatably fitted to a connecting member 116 at a connecting portion 1153 of the passage forming portion 1152.

The connecting portion 1153 is fixed to a lift plate 120 which is moved up and down between a heating position 1191 and a transfer position 1192 by a lifter unit 119 having, in this embodiment, an air cylinder. The lifter unit 119 is attached to a base plate 114 and controlled in operation by a control unit 180. It is noted that the lift plate 120 is supported and guided for up-and-down motion by two guide members 121.

When the joint 115 is attached to the turntable 1112, the fitting portion 1151 of the joint 115 is buried in the turntable 1112 so that the mounting surface 11121 of the turntable 1112 and one end surface 1151a of the joint 115 are positioned in the same plane. In the state that the joint 115 is buried in the turntable 1112, within the joint 115 are provided a gas suction passage 1154 which communicates with the suction passage 11126 in the turntable 1112 and which extends within the passage forming portion 1152 along the passage forming portion 1152, and a suction blow passage 1155 which communicates with a gas inlet/outlet passage 11115 within the wafer stage 1111 and which extends within the passage forming portion 1152 along the passage forming portion 1152.

The gas suction passage 1154 is connected to the suction unit 117 via the connecting member 116. The suction unit 117 is controlled in operation by the control unit 180. Air in the first suction groove 11122 and the second suction groove 11123 is sucked out by operation of the suction unit 117 via the gas suction passage 1154 and the suction passage 11126. Also, the suction blow passage 1155 is connected to a suction blow unit 118 via the connecting member 116. The suction blow unit 118 is controlled in operation by the control unit 180, and gas is sucked or blown through gas inlet/outlet holes 11112 via the suction blow passage 1155 and the gas inlet/outlet passage 11115 by operation of the suction blow unit 118.

The connecting member 116, and the connecting portion 1153 of the passage forming portion 1152 rotatably fitted to the connecting member 116 as described above, are held airtight with a seal structure using a seal member such as an O-ring. Therefore, gas flowing through the gas suction passage 1154 and the suction blow passage 1155 never leaks outside.

Figure 4:
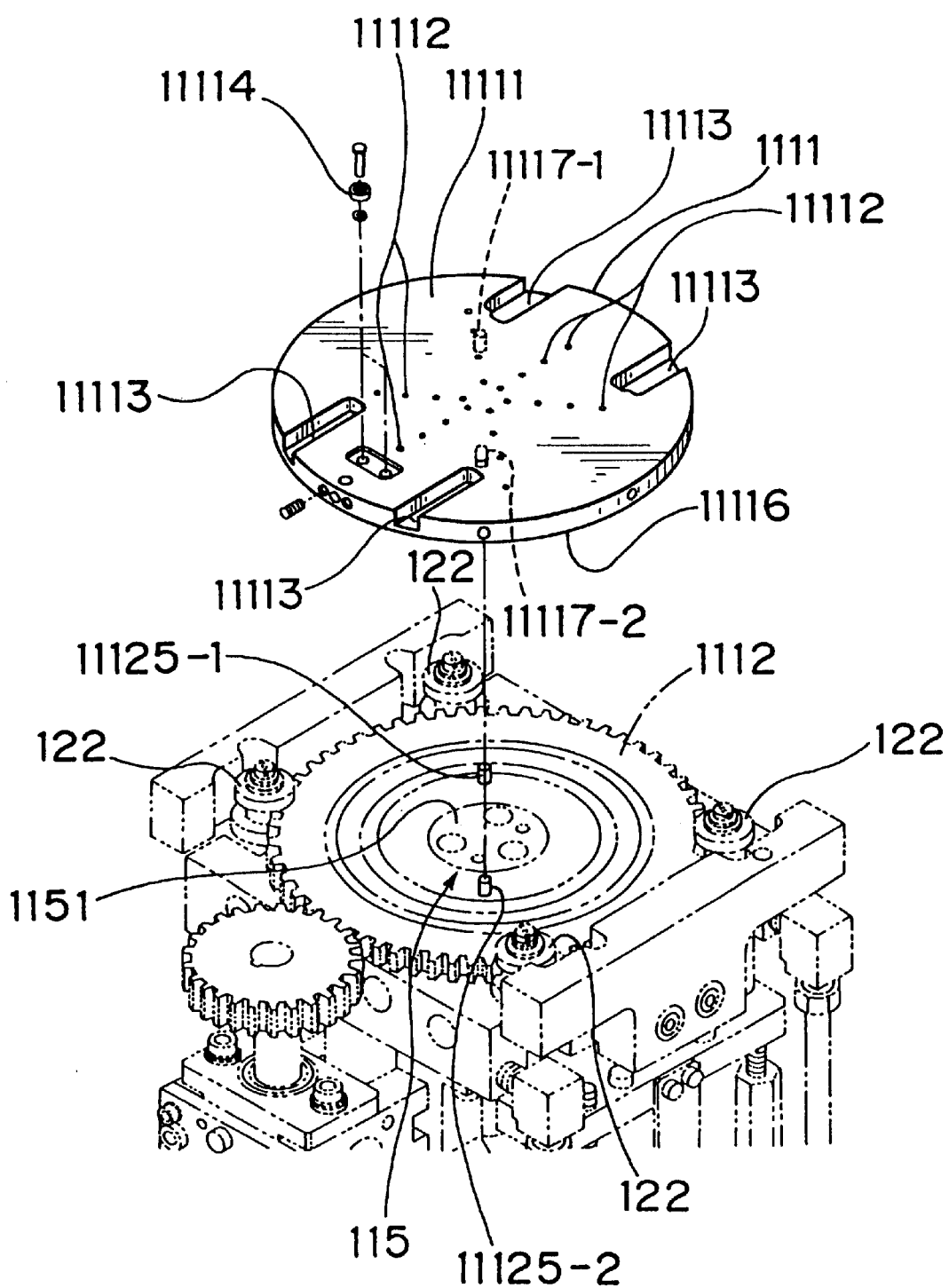
FIG. 4 is a perspective view showing a wafer stage part provided in the bump-bonding heating apparatus shown in FIG. 1.

The wafer stage 1111 is manufactured by tempering at a temperature beyond the temperature of 210° C., so it will not exhibit warpage by heating to the temperature of about 210° C. Therefore, the wafer stage 1111 can be held to the turntable 1112 by suction as described above. Also, at the mounting surface 11111 of the wafer stage 1111, on which the bump-unformed wafer 201 is to be mounted, as shown in FIG. 4, are opened the gas inlet/outlet holes 11112 for sucking and blowing the bump-unformed wafer 201. Further at the mounting surface 11111, an escape groove 11113 into which holding claws 1412 of a wafer holding part 1411 holding the bump-unformed wafer 201 enter when the bump-unformed wafer 201 is mounted onto the mounting surface 11111. Further, provided at the mounting surface 11111 are two positioning rollers 11114 with which an orientation flat portion of the bump-unformed wafer 201 mounted on the mounting surface 11111 makes contact, and which are used for regulating the bump-unformed wafer 201. The gas inlet/outlet holes 11112 communicate with the gas inlet/outlet passage 11115 formed in the wafer stage 1111.

In a rear surface 11116 of the wafer stage 1111 confronting the mounting surface 11111, are formed pin insertion holes 11117-1, 11117-2 in correspondence to the positioning pins 11125-1, 11125-2 erectly provided on the turntable 1112. The pin insertion hole 11117-1 has a cylindrical shape having such a hole diameter as to fit to the positioning pin 11125-1, and the pin insertion hole 11117-2 has an elongated hole shape extending along a direction of the diameter of the wafer stage 1111. This is intended to allow any thermal expansion of the wafer stage 1111, which is caused by the heating of the wafer stage 1111 to the temperature of about 210° C., to be absorbed.

By the arrangements that the wafer stage 1111 is held by suction to the turntable 1112 and that the pin insertion hole 11117-2 is elongated, as described above, the wafer stage 1111 is allowed to freely stretch even when heated tot he temperature of about 210° C., and is thus free from occurrence of any deformations which would occur if the stretching was restricted. Accordingly, the entire rear surface 11116 of the wafer stage 1111 is permitted to make contact with the mounting surface 11121 of the turntable 1112, so that temperature of the wafer stage 1111 becomes generally uniform over the entire wafer stage 1111. Therefore, the bump-uniformed wafer 201 mounted on the wafer stage 1111 can be heated generally uniformly.

The wafer heating unit 113, on which the turntable 1112 is mounted as described above, heats the bump-unformed wafer 201 to the bump bonding temperature via the turntable 1112 and the wafer stage 1111 of the wafer turning member 111. Also, as described later, whereas the wafer turning member 111 is turned circumferentially by the turning unit 112, the wafer heating unit 113 is inhibited from turning in the meantime.

Figure 6:
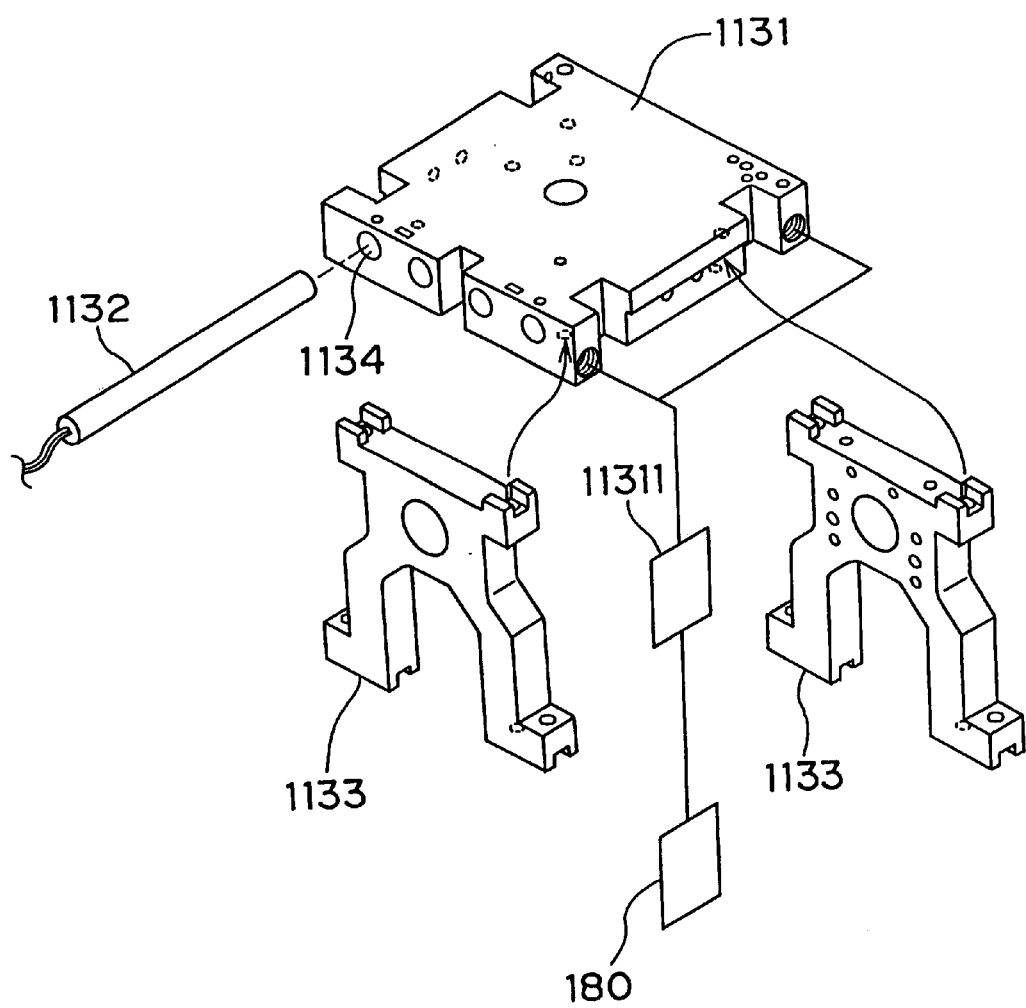
FIG. 6 is a perspective view showing a heating unit provided in the bump-bonding heating apparatus shown in FIG. 1.

The wafer heating unit 113, as shown in FIG. 6, has a turntable mounting plate 1131 on which the turntable 1112 is to be mounted, heaters 1132, and support members 1133. To the turntable mounting plate 1131, as shown in FIG. 6, is connected a suction device 11311 which is controlled in operation by the control unit 180, and the turntable 1112 mounted on the turntable mounting plate 1131 is held on the turntable mounting plate 1131 by suction operation of the suction device 11311. The heaters 1132 are heaters of cartridge type, in this embodiment, each of which is inserted into a hole 1134 formed in the turntable mounting plate 1131 along a direction perpendicular to the thicknesswise direction of the turntable mounting plate 1131, and four heaters 1132 are arranged in parallel to one another in this embodiment. The support members 1133 are members for supporting the turntable mounting plate 1131 onto the base plate 114 of the bump-bonding heating apparatus 110.

The turntable mounting plate 1131 is heated by the heating of the heaters 1132, and heat of the turntable mounting plate 1131 is transferred to the turntable 1112 while part of the heat is transferred also to the support members 1133. In this case, if the support members 1133 are arranged so as to extend in the same direction as an extended direction of the heaters 1132, heat of heaters 1132 closer to the support members 1133 would be more likely to be transferred to the support members 1133, as compared with heat of heaters 1132 farther from the support members 1133.

Therefore, the turntable mounting plate 1131 would not become generally uniform in temperature as a whole, causing a problem that the turntable 1112 mounted on the turntable mounting plate 1131 and besides the bump-unformed wafer 201 would not become generally uniform in temperature as a whole. Moreover, it is difficult for the heaters 1132 to produce heat generally uniformly over their entire lengths at the beginning of heating, with the result that each of the heaters 1132 would be lower in temperature at its two end portions than at its central portion.

This being the case, in this embodiment, in order that heat transfer from the heaters 1132 to the support members 1133 is not biased and that the entire turntable mounting plate 1131 becomes generally uniform in temperature as a whole, the support members 1133 are arranged so as to extend along a direction perpendicular to the thicknesswise direction of the turntable mounting plate 1131 and the extended direction of the heaters 1132, and in correspondence to the two end portions of each of the individual heaters 1132.

By such a constitution, heat is transferred from each of the four heaters 1132 to the support members 1133, so that the whole turntable mounting plate 1131 can be brought into a generally uniform temperature, and that the whole bump-unformed wafer 201 can be brought into a generally uniform temperature.

The turning unit 112 has a driving source 1121, a gear wheel 1122, and a rotational-force transmission mechanism 1123. The driving source 1121 is implemented by a servomotor in this embodiment and controlled in operation by the control unit 180. The gear wheel 1122 is meshed with the teeth 11127 of the turntable 1112. The rotational-force transmission mechanism 1123 prevents the heat of the turntable 1112 from transferring to the driving source 1121 and transmits driving force generated by the driving source 1121 to the gear wheel 1122 to thereby rotate the gear wheel 1122. In this embodiment, a timing belt is used as the rotational-force transmission mechanism 1123, but the mechanism is not limited to this structure.

Figure 9:
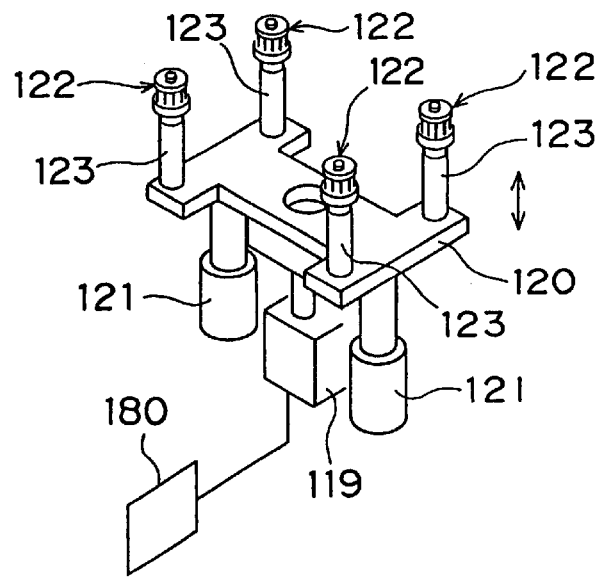
FIG. 9 is a perspective view showing a part for lifting and lowering the guide rollers shown in FIG. 1.
Figure 10:
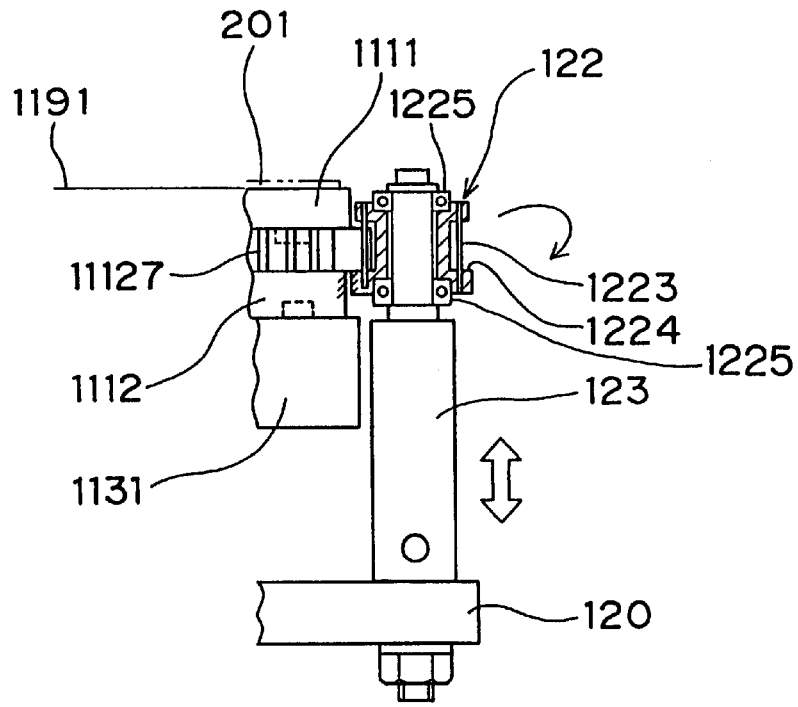
FIG. 10 is a view in which the turntable and the wafer stage provided in the bump-bonding heating apparatus shown in FIG. 1 are positioned at a heating position.
Figure 11:
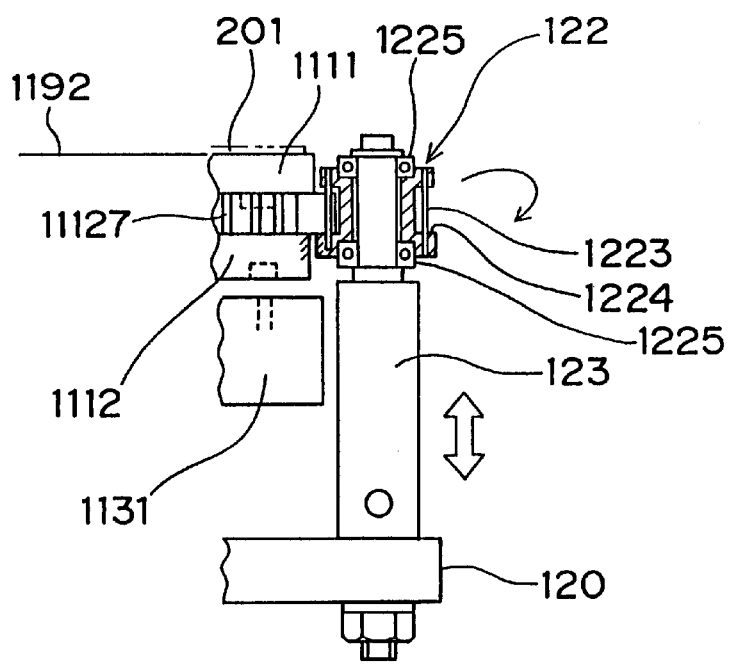
FIG. 11 is a view in which the turntable and the wafer stage provided in the bump-bonding heating apparatus shown in FIG. 1 are positioned at a transfer position.
Figure 1:
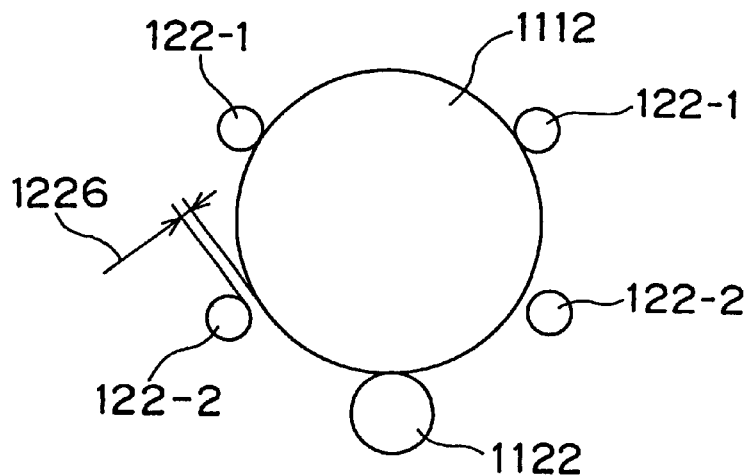
Figure 1:
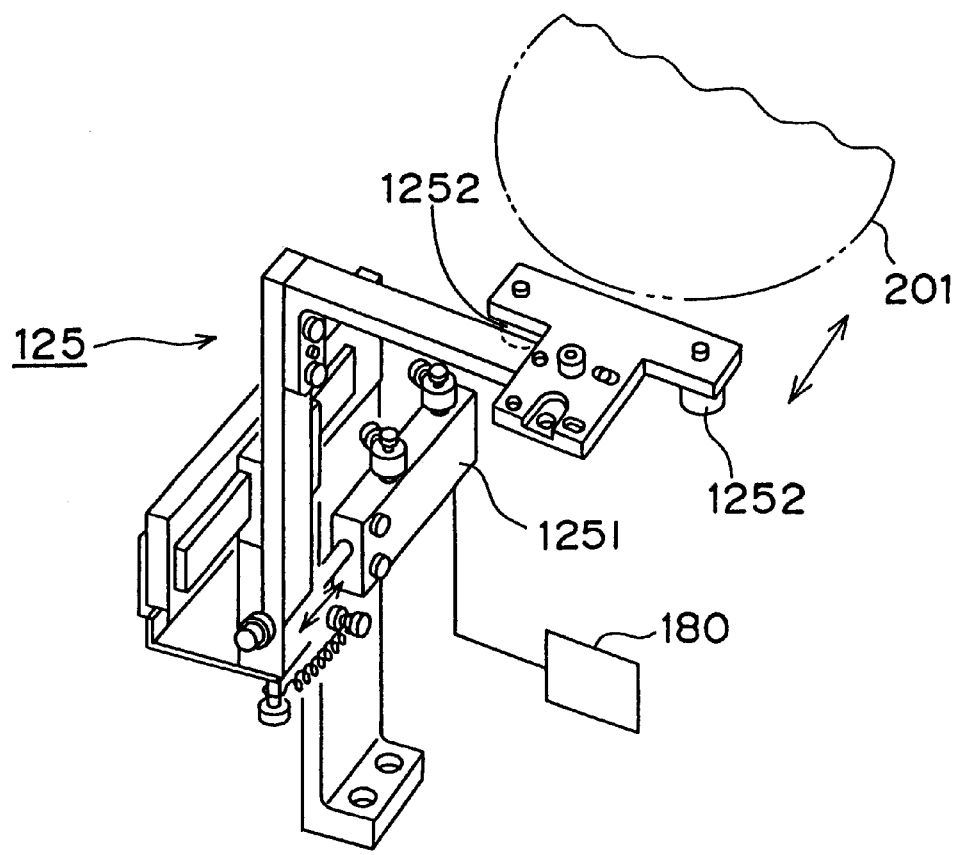

In the lift plate 120 that is moved up and down between the heating position 1191 and the transfer position 1192 by the lifter unit 119, as shown in FIGS. 9 to 11, four stays 123 are erectly provided in correspondence to four places so as to be circumferentially and equidistantly spaced from one another around the turntable 1112. At a tip end of each stay 123, a guide roller 122 is rotatably supported by each stay 123. The guide roller 122 is to mesh with the teeth 11127 formed at the periphery of the turntable 1112 and moves the turntable 1112 up and down between the heating position 1191 and the transfer position 1192 in correspondence to up and down movement of the lift plate 120.

Figure 7:
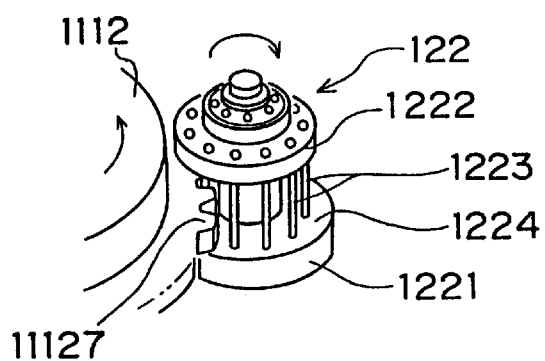
FIG. 7 is a perspective view showing guide rollers provided in the bump-bonding heating apparatus shown in FIG. 1.

As shown in FIG. 7, each guide roller 122 is so structured that a cylindrical body rotatably supported on the stay 123 by bearings 1225, and a lower flange 1221 and an upper flange 1222 protruding diametrically of the cylindrical body at its lower and upper end portions, are integrally formed, and that pins 1223 are provided between the lower flange 1221 and the upper flange 1222 at peripheral portions of the lower flange 1221 and the upper flange 1222. A pitch of the pins 1223 arranged along the peripheries of the lower flange 1221 and the upper flange 1222 is equal to a pitch of the teeth 11127 of the turntable 1112. Therefore, in response to the rotation of the turntable 1112 by operation of the turning unit 112, each guide roller 122 also rotates.

Each guide roller 122 constructed as described above prevents the turntable 1112 from shifting diametrically on the turntable mounting plate 1131, and moves the turntable 1112 up and down as described above by the contact of the lower flange 1221 with the teeth 11127 of the turntable 1112.

Figure 8:
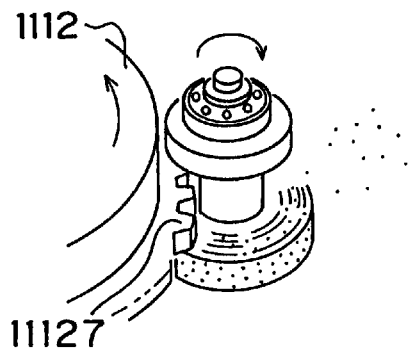
FIG. 8 is a perspective view showing a modified example of the guide rollers shown in FIG. 7.

With the aformentioned functions of the guide roller 122, the guide roller 122 does not necessarily need to turn in one-to-one correspondence together with the turnable 1112. So it is also possible that, as shown in FIG. 8, a lower flange and the teeth 11127 of the turnable 1112 are brought into contact with each other without providing the pins 1223. With this structure, however, since a guide roller may not rotate in one-to-one correspondence with the rotation of the turnable 1112, the result is that the lower flange and the teeth 11127 rub more with each other that in the case of the guide roller 122 of the embodiment. Therefore, because of a higher likelohood of production of dust due to wear, there araise a need of some additional contermeasure for dust.

Although the guide roller 122 of this embodiment has less generation of dust as described above, anticorrosion, heat-proof quenched steel is used for the lower flange 1221 so that the generation of dust is further reduced.

Also, as shown in FIG. 12, when the turntable 1112 is rotated by the gear wheel 1122 of the turning unit 112, the four guide rollers 122 are so structured that each of two guide rollers 122-1 positioned farther from the gear wheel 1122 has no gap generated between a root of the teeth 11127 of the turntable 1112 and the pin 1223 engaged with the root, and that, on the other hand, each of two guide rollers 122-2 positioned closer to the gear wheel 1122 has a gap generated between the root of the teeth 11127 of the turntable 1112 and the pin 1223. It is noted that in this embodiment, the gaps 1226 are set each to 0.27 mm in the diametral direction of the turntable 1112 at ordinary temperature.

Whereas the turntable 1112 is heated to about 210° C. as described above, provision of the gaps 1226 allows thermal expansions of the turntable 1112 due to heat. This produces an effect of preventing the turntable 1112 from deformation such as warpage so that the turntable 1112 becomes generally uniform in temperature as a whole, and therefore that the bump-unformed wafer 201 on the wafer stage 1111 becomes generally uniform in temperature as a whole.

Figure 3:
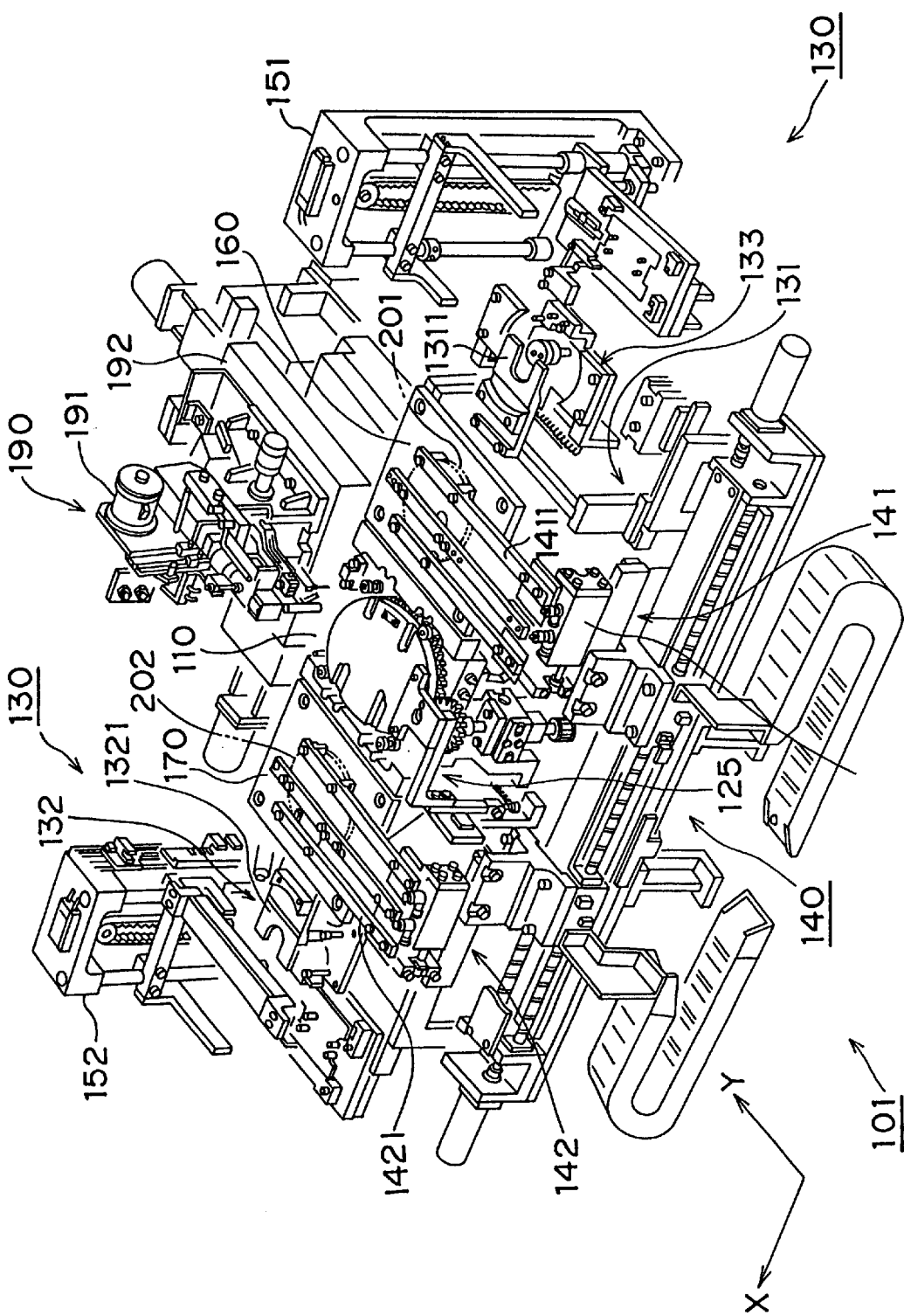
FIG. 3 is a perspective view of a bump forming apparatus according to an embodiment of the invention.

Further in the bump-bonding heating apparatus 110, a wafer regulation unit 125 is provided, as shown in FIGS. 3 and 13, in order to set the bump-unformed wafer 201 to a specified position on the wafer stage 1111 when the bump-unformed wafer 201 is mounted onto the wafer stage 1111. The wafer regulating unit 125 has two regulating rollers 1252 making contact with a rim of the bump-unformed wafer 201 placed on the wafer stage 1111, and a driver part 1251 which moves the regulating rollers 1252 diametrically of the bump-unformed wafer 201 and which is controlled in operation by the control unit 180.

The bump forming apparatus 101 has, roughly speaking, one bump-bonding heating apparatus 110 as described above, one bump-forming head 190, a carrier unit 130, a transfer units 140 provided on carriage-in and -out sides respectively, lifter units 151, 152 provided for the containers respectively, to lift those respective containers a pre-heater unit 160, a post-heater unit 170, and a control unit 180.

The bump-forming head 190 is a device for forming a bump at the electrode of the bump-unformed wafer 201 mounted to the bump-bonding heating apparatus 110 and heated to the bump bonding temperature. The bump-forming head 190 has a wire feed portion 191 for feeding gold wire serving as a bump material, and besides a bump forming portion for forming a ball by melting the gold wire and then pressing the melting ball to the electrode, an ultrasonic generator for making ultrasonic waves act on the bump at the time of the pressing, and the like. The bump-forming head 190 as constructed above is placed on an X-Y table 192 having, for example, a ball screw structure and being movable in X- and Y-directions perpendicular to each other on a plane. The bump-forming head 190 is moved in the X- and Y-directions by the X-Y table 192 so that the bump can be formed at each of the electrodes of the bump-unformed wafer 201 placed and fixed on the X-Y table 192.

The bump forming apparatus 101 is equipped with two kinds of carrier units 130. A carriage-in unit 131, which is one of the carrier units 130, is a device for extracting the bump-unformed wafer 201 from the first container, and a carriage-out unit 132, the other one, is a device for carrying the bump-formed wafer 202 after bump formation to the second container and accommodating the wafer therein. The carriage-out unit 132 has the same structure and operates in the same manner, as the carriage-in unit 131.

At a place where the carriage-in unit 131 is disposed, is provided an orientation flat alignment unit 133 for orienting the orientation flat of the bump-unformed wafer 201 taken out of the first container 205 by the carriage-in unit 131 along a specified direction.

In the pre-heater unit 160, the bump-unformed after 201 transferring from the carriage-in unit 131 and held by the holding part 1411 is mounted on the pre-heater unit 160, and then the pre-heater unit 160 increases the temperature of the bump-unformed wafer 201 from room temperature to the bump bonding temperature of about 210° C., at which bump formation is performed, with the bump-bonding heating apparatus 110.

In the post-heater unit 170, after the bump formation, the bump-formed wafer 202 transferring from the bump-bonding heating apparatus 110 and held by the wafer holding portion 1421 is mounted on the post-heater unit 170, and then the post-heater unit 170 decreases gradually the temperature of the bump-formed wafer 202 from the bump bonding temperature of about 210° C. to around room temperature.

Although the bump forming apparatus of this embodiment has been shown in a case where the pre-heater unit 160 and the post-heater unit 170 are provided, it is also possible that temperature increasing and decreasing operations from the pre-heating operation to the post-heating operation are performed by the bump-bonding heating apparatus 110 without providing the pre-heater unit 160 and the post-heater unit 170.

Operation of the bump-bonding heating apparatus 110 provided in the bump forming apparatus 101 as described above is explained below. It is noted that the operation is controlled by the control unit 180.

Figure 14:
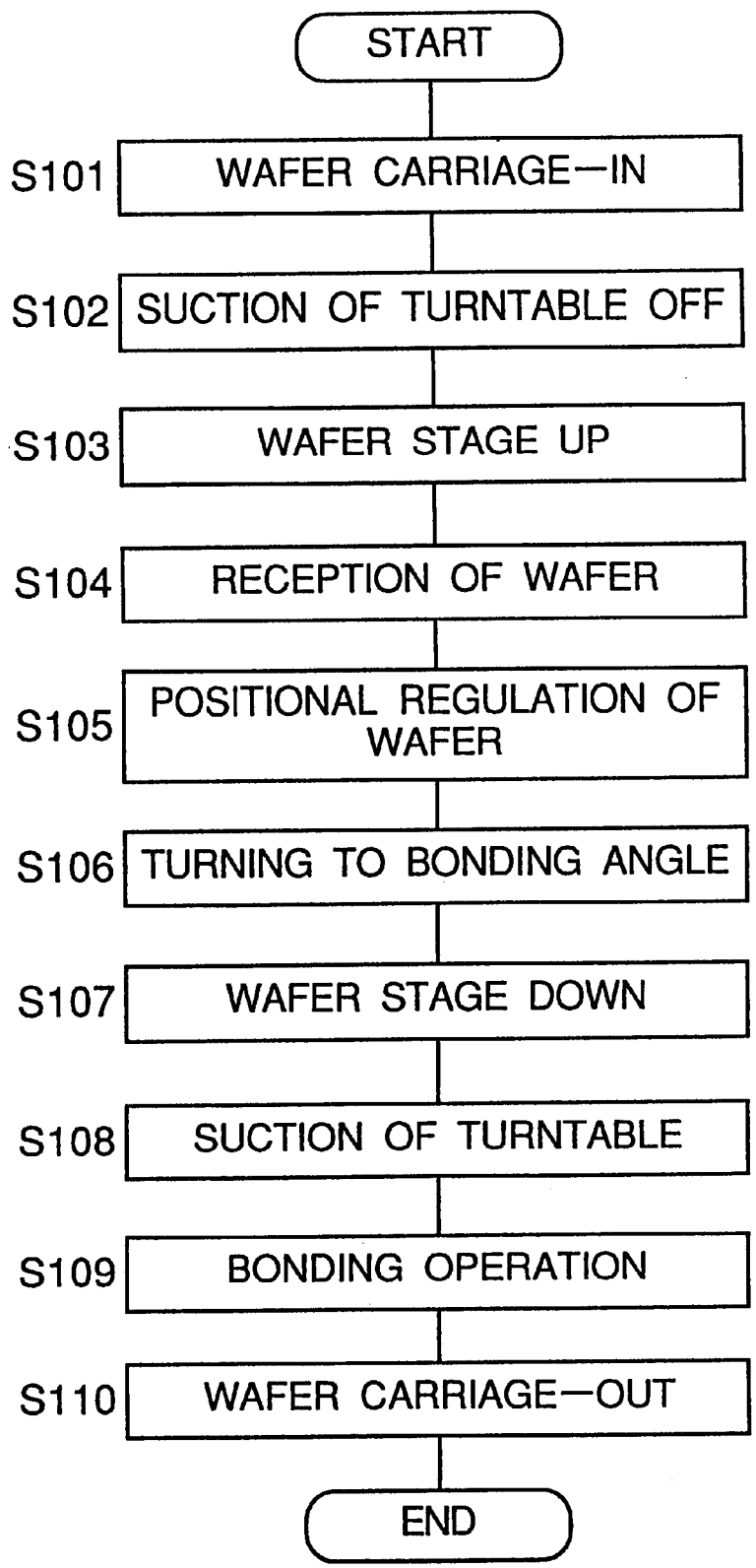
FIG. 14 is a flowchart showing operation of the bump-bonding heating apparatus shown in FIG. 1.
Figure 15:
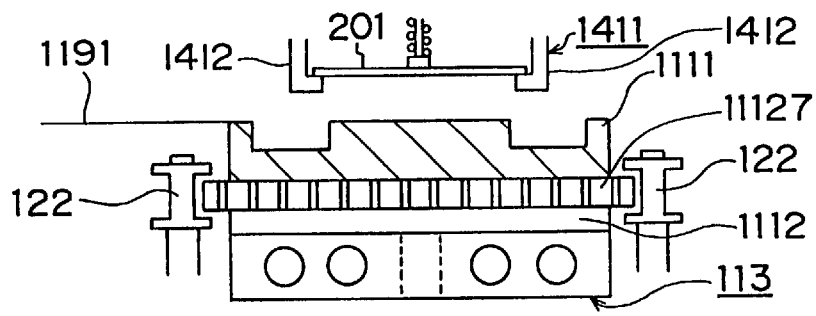
FIG. 15 is a view showing a state in which a wafer is carried into the bump-bonding heating apparatus shown in FIG. 1.

At a step (represented by "S" in the figure) 101 of FIG. 14, as shown in FIG. 15, the bump-unformed wafer 201 held by the holding part 1411 is carried from the pre-heater unit 160 into the bump-bonding heating apparatus 110 as described above.

At the next step 102, suction operation by the suction device 11311 that the turntable 1112 is sucked to the turntable mounting plate 1131 provided in the heating unit 113 is halted. Before the halt of the sucking operation, the turntable 1112 and the wafer stage 1111 have already been increased in temperature to about 210° C. by the heating apparatus 110.

At the next step 103, the lifter unit 119 is operated so that the lift plate 120 is lifted from the heating position 1191 toward the transfer position 1192. By this lifting operation, the connecting member 116 fixed to the lift plate 120, and the guide rollers 122 rotatably supported on the stays 123 erectly provided on the lift plate 120 are lifted together concurrently. By the guide rollers 122 being lifted, as shown in FIG. 11, the turntable 1112, on which the wafer stage 1111 is mounted, is lifted up to the transfer position 1192 via the teeth 11127 making contact with the lower flanges 1221 of the guide rollers 122. In addition, since the joint 115 fixed to the turntable 1112 is also lifted along with the turntable 1112, the connecting member 116 and the connecting portion 1153 of the joint 115 are lifted integrally together without exhibiting positional shifts in the up-and-down direction. Further since lowering operation is similar to the lifting operation, the connecting member 116 and the connecting portion 1153 of the joint 115 never exhibits positional shifts in the up-and-down direction.

Figure 16:
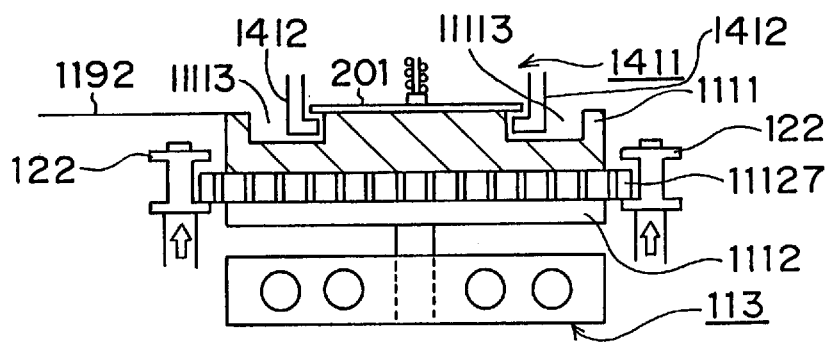
FIG. 16 is a view of a state that the bump-bonding heating apparatus shown in FIG. 1 is lifted to the transfer position for reception of the wafer.
Figure 19:
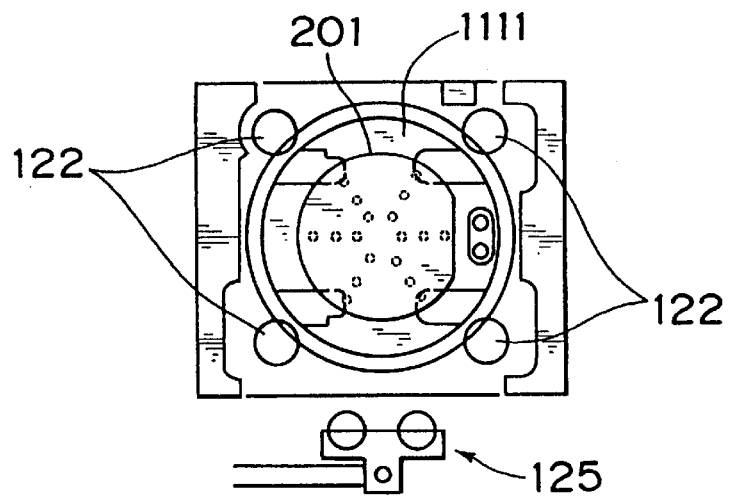
FIG. 19 is a plan view showing a state in which the wafer is mounted on the bump-bonding heating apparatus shown in FIG. 1.

By the wafer stage 1111 having reached the transfer position 1192 at the step 103, the wafer stage 1111 comes into contact with the bump-unformed wafer 201 held by the holding part 1411 at step 104 as shown in FIGS. 16 and 19, where the bump-unformed wafer 201 is received onto the wafer stage 1111 and mounted onto the wafer stage 1111.

Figure 17:
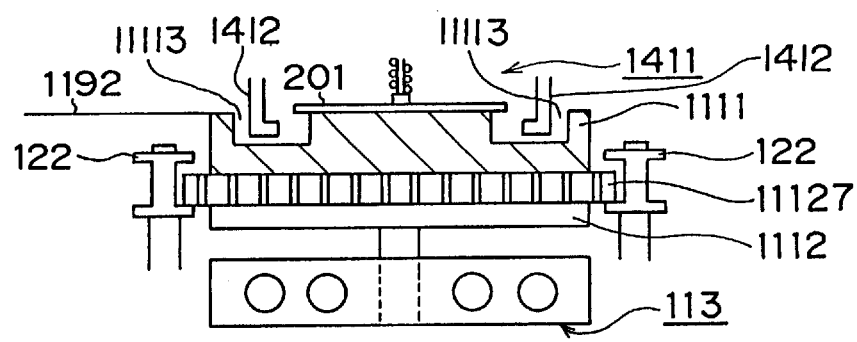
FIG. 17 is a view of a state that the wafer has been received by the bump-bonding heating apparatus shown in FIG. 1.

In this state, at step 105, a position-regulating operation of the bump-unformed wafer 201 on the wafer stage 1111 is performed. That is, as shown in FIG. 17, the holding claws 1412 of the holding part 1411 are opened and then the bump-unformed wafer 201 is released from being held. Further the suction blow unit 118 operates so that a gas, which is clean air or nitrogen gas in this embodiment, is jetted out through the gas inlet/outlet holes 11112 of the wafer stage 1111 via the suction blow passage 1155 and the gas inlet/outlet passage 11115. In the blowing operation, since the bump-unformed wafer 201 has been preheated, the jetted-out gas has been heated to such a temperature as to hardly lower the temperature of the bump-unformed wafer 201.

Figure 20:
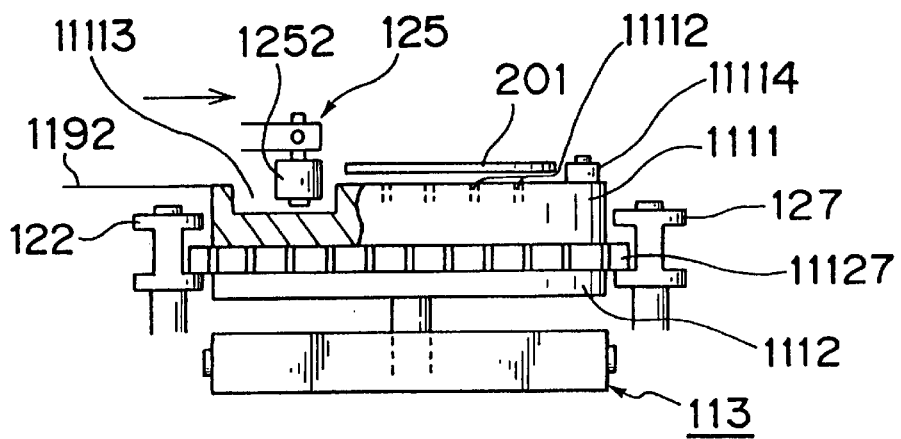
FIG. 20 is a view showing a state in which the wafer regulating unit provided in the bump-bonding heating apparatus shown in FIG. 1 performs wafer regulation.

By the jet-out of the gas, the bump-unformed wafer 201 is floated about 0.5 mm from the wafer stage 1111. While the bump-unformed wafer 201 is floating, the regulating rollers 1252 of the wafer regulating unit 125 are moved diametrically of the bump-unformed wafer 201 by the drive part 1251 as shown in FIG. 20 and then come into contact with the rim of the bump-unformed wafer 201. And then the regulating rollers 1252 push forward the bump-unformed wafer 201 until the orientation flat of the bump-unformed wafer 201 makes contact with the positioning rollers 1114. Thus, the orientation flat of the bump-unformed wafer 201 is regulated so that the orientation flat takes after the positioning rollers 11114. By this operation, the positional regulation is achieved.

After an end of this positional regulation operation, the suction blow unit 118 halts the gas jet-out operation, starting a suction operation. As a result, air is sucked through the gas inlet/outlet holes 11112 by this suction operation, by which the bump-unformed wafer 201 is sucked onto the wafer stage 1111.

Figure 21:
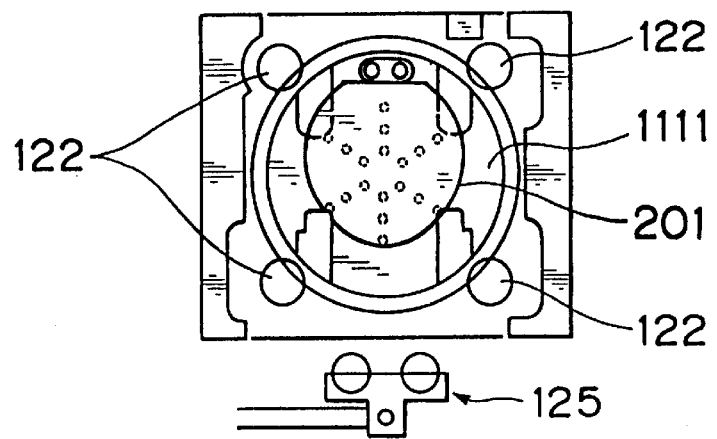
FIG. 21 is a plan view showing a state after the wafer regulating operation by the wafer regulating unit provided in the bump-bonding heating apparatus shown in FIG. 1 has been done.

At the next step 106, the driving source 1121 of the turning unit 112 operates, by which the turntable 1112 is rotated to a bonding angle by the gear wheel 1122 as shown in FIG. 21. It is noted that the bonding angle refers to an angle as follows. That is, since the bump-forming head 190 can be moved only in the X- and Y-directions by the X-Y table 192, when the bumps are formed on a wafer on which devices are formed in a skewed direction with respect to the crystal orientation of the wafer, it is preferable that either one direction of the X- and Y-directions and the skewed direction are made coincident with each other, because a travel amount of the X-Y table 192 becomes smaller, so that cycle time can be reduced. Therefore, the bonding angle is a rotational angle of the wafer for making one direction and the skewed direction coincident with each other. The one direction is either one direction of the X- and Y-directions, i.e., a crystal orientation of a semiconductor wafer prior to the formation of circuit devices or a direction perpendicular to a direction of the crystal orientation.

Also, such bonding angles are stored in a storage part within the control unit 180 according to types of the wafers to be processed, and read out, as required, by the control unit 180. Then, the control unit 180 controls the operation of the driving source 1121 so that a turn corresponding to the bonding angle is achieved.

In this embodiment, as described above, a servomotor is used as the driving source 1121, and the turntable 1112 having the teeth 11127 for mesh with the gear wheel 1122 is turned by the gear wheel 1122 that is rotated by the servomotor. Therefore, the bump-unformed wafer 201 can be turned with far higher accuracy, as compared with the conventional gas floating type. Accordingly, even if rotation corresponding to the bonding angle is required, the bump-unformed wafer 201 can be rotated with high accuracy.

Since the gear wheel 1122 and the teeth 11127 are engaged with each other, there would occur a turning-amount error due to a backlash when the turning operation is performed. Therefore, this embodiment also adopts a known error correcting method such as a method of performing forward and reverse rotations.

Figure 18:
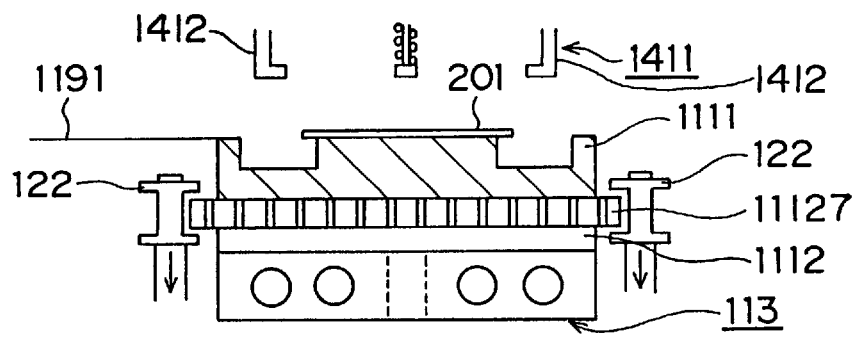
FIG. 18 is a view showing a state that the wafer has been received by the bump-bonding heating apparatus shown in FIG. 1 and returned to the heating position.

At the next step 107, as shown in FIG. 18, the lifter unit 119 is operated so that the lift plate 120 is lowered from the transfer position 1192 toward the heating position 1191. By this lowering operation, the guide rollers 122 also lower, causing the turntable 1112 to lower, so that the wafer stage 1111 on the turntable 1112 is moved to the heating position 1191. Then at the next step 108, the suction device 11311 is operated again so that the turntable 1112 is sucked to the turntable mounting plate 1131 of the heating apparatus 110. As a result of this, the turntable 1112 is heated again to about 210° C. to make up for a degree to which the turntable 1112 has been cooled by the foregoing lifting operation. Thus the bump-unformed wafer 201 is heated to the bump bonding temperature. It is noted that the bump-unformed wafer 201 has already been heated nearly to the bump bonding temperature by the preheating operation.

Then, at the next step 109, bumps are formed on the electrodes in circuit portions of the bump-unformed wafer 201 by the bump-forming head 190. After this bump formation, at a step 110, the bump-formed wafer 202 is carried out from on the wafer stage 1111 by the wafer holding portion 1421 of the carriage-out side transfer device 142.

According to this embodiment, by the provision of the bump-bonding heating apparatus 110, troublesome factors such as needs of controlling the pressure, flow rate and the like of the jetted-out gas depending on the size and weight of the semiconductor wafer, as involved in the conventional gas floating type, are eliminated, so that the bump forming apparatus becomes easier to handle. Further, the bump-unformed wafer 201 can be rotated with far higher accuracy, as compared with the conventional gas floating type, so that the bump-unformed wafer 201, even if required to be turned to an extent of the bonding angle, can be rotated with high accuracy. Furthermore, the heating apparatus 110 for heating the turntable 1112 and so on is not rotated, and a compact apparatus configuration can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bump forming method comprising:
   mounting a semiconductor wafer, on which bumps are to be formed, onto a wafer turning member;
   turning only the wafer turning member with the semiconductor wafer placed thereon along a circumferential direction of the semiconductor wafer at a turning angle required for the semiconductor wafer without turning a wafer heating unit provided for heating the semiconductor wafer to a bump bonding temperature via the wafer turning member; and
   after the turning, bonding the bumps on the semiconductor wafer at the bump bonding temperature.

2. The bump forming method according to claim 1, further comprising, after mounting the semiconductor wafer onto the wafer turning member and before turning the wafer turning member, performing positional regulation of the semiconductor wafer on the wafer turning member by floating the semiconductor wafer from the wafer turning member.

3. A semiconductor wafer on which a bump is formed by the bump bonding method as defined in claim 1.

4. A semiconductor wafer on which bumps are formed in a circuit by a process comprising, after forming the circuit along a direction which is different from a crystal orientation of the semiconductor wafer and is skewed with respect to the crystal orientation, turning the semiconductor wafer at an angle which depends on a difference between the crystal orientation and the skewed direction.

* * * * *